(12) United States Patent
Lee (10) Patent No.: US 7,642,590 B2
(45) Date of Patent: Jan. 5, 2010

(54) SEMICONDUCTOR DEVICE AND METHOD FOR MAKING THE SAME

(75) Inventor: Pei-Ing Lee, Changhua County (TW)

(73) Assignee: Nanya Technology Corporation, Taoyuan (TW)

( * ) Notice: Subject to any disclaimer, the term of this patent is extended or adjusted under 35 U.S.C. 154(b) by 249 days.

(21) Appl. No.: 11/942,421

(22) Filed: Nov. 19, 2007

(65) Prior Publication Data

US 2008/0061342 A1    Mar. 13, 2008

Related U.S. Application Data

(62) Division of application No. 11/321,156, filed on Dec. 28, 2005, now Pat. No. 7,358,133.

(51) Int. Cl.
*H01L 27/108* (2006.01)

(52) U.S. Cl. ............... 257/303; 257/306; 257/E27.084

(58) Field of Classification Search ......... 257/300–309, 257/E27.084
See application file for complete search history.

(56) References Cited

U.S. PATENT DOCUMENTS 7,538,375 B2 * 5/2009 Kim et al. ................. 257/306

| | | | |
|---|---|---|---|
| 2002/0105019 A1* | 8/2002 | Mandelman et al. | 257/296 |
| 2005/0067648 A1* | 3/2005 | Hung et al. | 257/301 |
| 2006/0270151 A1* | 11/2006 | Lee | 438/243 |
| 2007/0028435 A1* | 2/2007 | Ormachea et al. | 29/91 |
| 2007/0040202 A1* | 2/2007 | Enders et al. | 257/301 |
| 2007/0057301 A1* | 3/2007 | Wang et al. | 257/296 |

* cited by examiner

*Primary Examiner*—Richard A. Booth
(74) *Attorney, Agent, or Firm*—Quintero Law Office (57) ABSTRACT

A method for forming a semiconductor device is provided. The method comprises providing a substrate with recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions are patterned to form parallel shallow trenches for defining buried bit line contacts and capacitor buried surface straps. A layer of dielectric material is formed in the shallow trenches. Word lines are formed across the recessed gates. Bit lines are formed to electrically connect the buried bit line contacts without crossing the capacitor buried surface straps, and stack capacitors are formed to electrically connect with the capacitor buried surface straps. A semiconductor device is also provided.

8 Claims, 14 Drawing Sheets

SEMICONDUCTOR DEVICE AND METHOD FOR MAKING THE SAME

This application is a divisional of U.S. application Ser. No. 11/321,156, filed Dec. 28, 2005, the entire disclosure of which is hereby incorporated by reference.

BACKGROUND

The invention relates to a semiconductor device and a method for making the same, and more particularly to a semiconductor device with trench capacitors and stack capacitors and a method for fabricating the same.

Without limiting the scope of the invention, its background is described in connection with semiconductor devices and dynamic random access memory (DRAM) cells as examples.

It has been the trend to scale down the size of memory cells to increase the integration level and thus to increase the memory size of DRAM chips. As the size of memory cell is reduced, the capacity of the capacitor used in the memory cell is correspondingly reduced.

A memory cell of DRAM topically consists of a storage capacitor and an access transistor. Digital information is stored in the capacitor and accessed through the transistor, by way of addressing the desired memory cell via interlaced bit lines and word lines. In order to construct high density DRAMs in a reasonably sized chip area, both the transistor and capacitor elements must occupy less lateral space in each memory cell than in the previous generation DRAM designs. As DRAMs are scaled down there is a continuous challenge to maintain a sufficiently high stored charge in each memory cells. Efforts to increase capacitance without increasing the size of the occupied planar area of the capacitor have been concentrated on building three dimensional capacitor structures, which increase the capacitor surface area. Thus, cell structures have had to change from the conventional planar-type capacitors to either trench capacitors or stack capacitors. With the advent of large-scale integrated DRAM devices, the size of the devices has been continuously reduced such that the available area for a single memory cell has become very small. This causes a reduction in capacitor area, resulting in the reduction of cell capacitance.

SUMMARY

Accordingly, a major feature of the method for forming a semiconductor device is provided. An exemplary embodiment of a method for forming a semiconductor device comprises providing a substrate with recessed gates and deep trench capacitor devices therein. Protrusions of the recessed gates and upper portions of the deep trench capacitor devices are revealed. Spacers are formed on sidewalls of the upper portions and the protrusions. Buried portions of conductive material are formed in spaces between the spacers. The substrate, the spacers and the buried portions are patterned to form parallel shallow trenches for defining active regions, buried bit line contacts and capacitor buried surface straps. A layer of dielectric material is formed in the shallow trenches. Word lines are formed across the recessed gates. Bit lines are formed to electrically connect the buried bit line contacts without crossing the capacitor buried surface straps, and stack capacitors are formed to electrically connect with the capacitor buried surface straps.

According to another embodiment of the invention, the semiconductor device, comprising a substrate with recessed gates and deep trench capacitor devices therein, wherein protrusions of the recessed gates and upper portions of the deep trench capacitor devices are above the substrate, spacers on sidewalls of the upper portions and the protrusions, buried portions of conductive material in spaces between the spacers, wherein the buried portions comprise buried bit line contacts and capacitor buried surface straps, word lines lying across the recessed gates, upper bit line contacts on the buried bit line contacts, bit lines connecting to the upper bit line contacts, wherein the capacitor buried surface straps are not covered by the bit lines, and stack capacitors with plugs connecting to the capacitor buried surface straps.

DESCRIPTION OF THE DRAWINGS

The invention can be more fully understood by reading the subsequent detailed description and examples with reference made to the accompanying drawings, wherein.

DETAILED DESCRIPTION

The invention, which provides a method for forming a semiconductor device, will be described in greater detail by referring to the drawings that accompany the invention. It is noted that in the accompanying drawings, like and/or corresponding elements are referred to by like reference numerals. The following description discloses the best-contemplated mode of carrying out the invention. This description is made for the purpose of illustrating the general principles of the invention and should not be taken in a limiting sense. The scope of the invention is best determined by reference to the appended claims.

In this specification, expressions such as "overlying the substrate", "above the layer", or "on the film" simply denote a relative positional relationship with respect to the surface of a base layer, regardless of the existence of intermediate layers. Accordingly, these expressions indicate not only the direct contact of layers, but also, a non-contact state of one or more laminated layers.

Figure 1:
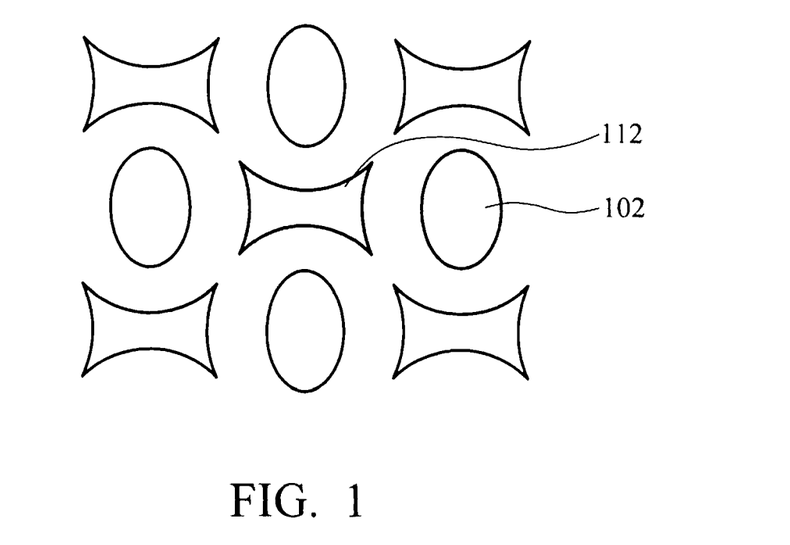
FIG. 1 is a top view illustrating an arrangement of deep trench capacitor devices and recessed gates of an embodiment of the invention.

FIG. 1 shows the top view of deep trench capacitor devices 102 and a recessed transistor 112, wherein the profiles of recessed transistor 112 is determined by surrounding deep trench capacitor devices 102 and the spacers on the side walls of upper portions of the deep trench capacitor devices 102.

Figure 2:
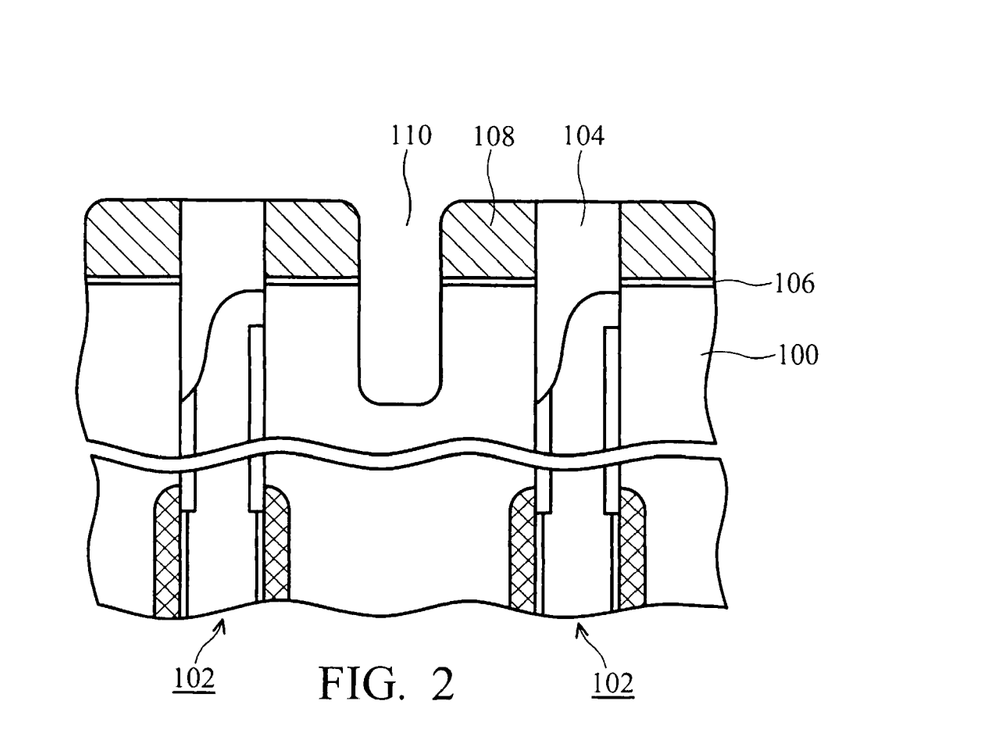
FIG. 2 is cross section view illustrating the method for forming recessed trenches of an embodiment of the invention.

Referring to FIG. 2, a substrate 100 with a pad layer 106 thereon is provided. The substrate 100 has deep trench capacitor devices 102 therein, and the upper portions 104 of the deep trench capacitor devices 102 are above the surface of the substrate 100. A spacer layer (not shown) is formed on the pad layer 106 and the upper portions 104 of the deep trench capacitor devices 102 by deposition. The spacer layer can be silicon nitride, silicon oxide, silicon oxynitride, a combination thereof, a stack layer thereof, polyimide, SOG, low K dielectric layer, such as FSG, Black Diamond, SILK™, FLARE™, LKD, Xerogel, or Aerogel, or other material. Preferably, the spacer layer comprises silicon nitride.

Next, the spacer layer is etched to form spacers 108 on sidewalls of the upper portions 104 of the deep trench capacitor devices 102. In the preferred embodiment of the invention, the etching step is anisotropic etching, which can use $CHF_3$, a combination of $CF_4$ and O2, or a combination of $C_2F_6$ as the main etchant, and can also be further enhanced with plasma when the spacer layer are silicon nitride. When the spacer layer are silicon oxide, the anisotropic etching can use $CHF_3$, a combination of $CF_4$ and $O_2$, a combination of $CF_4$, or $C_2F_6$ or $C_3F_8$ as the main etchant, and can also be further enhanced with plasma. Then, the pad layer 106 and the substrate 100 are etched to form a self-aligned recess trench 110 between the trench capacitor devices 102.

Figure 3:
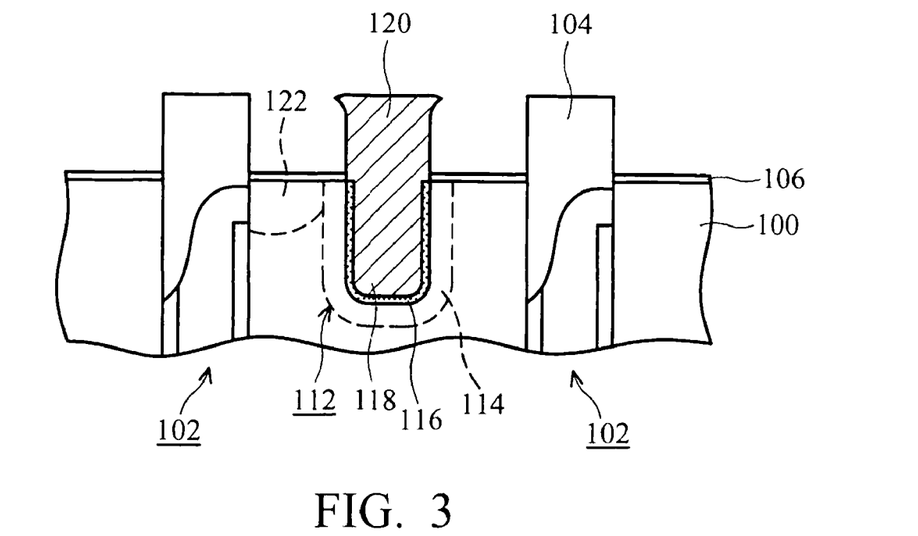
FIG. 3 is cross section view illustrating the method for forming recessed transistors with protrusions of an embodiment of the invention.

Referring to FIG. 3, the substrate 100 adjacent the recessed trench 110 is doped to form channel area 114 surrounding the recessed trench 110. A gate dielectric layer 116, preferably comprising silicon oxide, is then formed in the recessed trench 110 on the substrate 100. The gate dielectric layer 116 can be formed using a thermal process for example. A conductive material, such as polysilicon, tungsten or tungsten silicide, is filled into the recessed trench 110 to form a recessed gate electrode 118. An out diffusion region 122 is formed during the thermal process of forming the gate dielectric 116 and/or the other thermal process in following processes.

The upper portions 104 of deep trench capacitor devices 102, the spacers 108, and the upper surfaces of the recessed gate electrodes 118 are planarized, and the spacers 108 is then stripped by selective wet etching to reveal the upper portions 104 of deep trench capacitor devices 102 and the protrusions 120 of the recessed gate electrodes 118. The planarizing method may comprise a chemical mechanical polishing (CMP) process, a blanket etching back process or a recess etching process. The upper surfaces of the protrusions 120 of the recessed gate electrodes 118 are at substantially the same level as the upper portions 104 of the deep trench capacitor devices 102.

Figure 4:
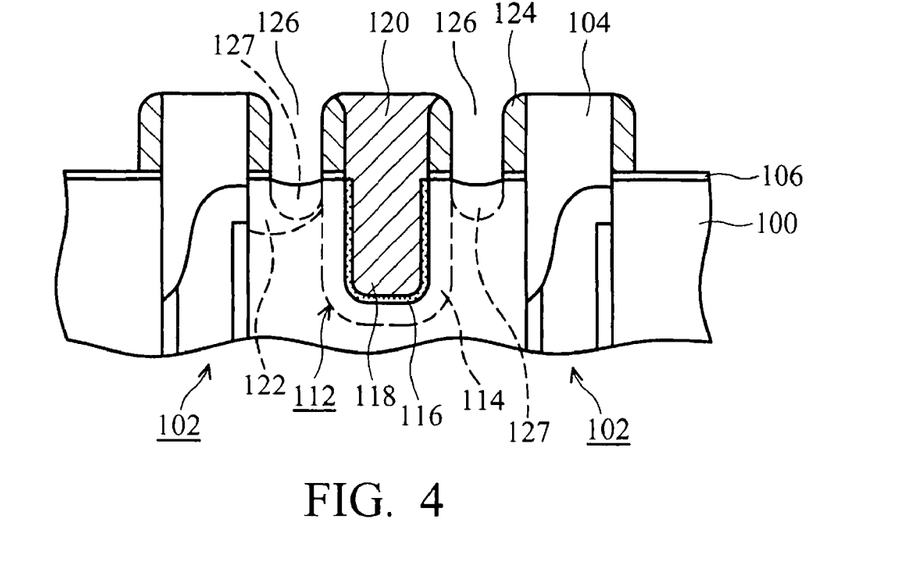
FIG. 4 is cross section view illustrating the method for forming spaces by spacers of an embodiment of the invention.

Referring to FIG. 4, spacers 124 are formed on sidewalls of the upper portions 104 and the protrusions 120 such that spaces 126 between the spacers 124 thereon are self-aligned. The spacers 124 can be formed by deposition and dry etching back, preferably a CVD silicon nitride film. Therefore, the spacers 124 enclose the upper portions 104 and the protrusions 120. And the substrate 100 is covered by the deep trench capacitor devices 102, the recessed transistor 112 and the spacers 124 beyond the circular spaces 126. Thereafter, an ion implantation is executed to form a circular implantation region 127.

Figure 5:
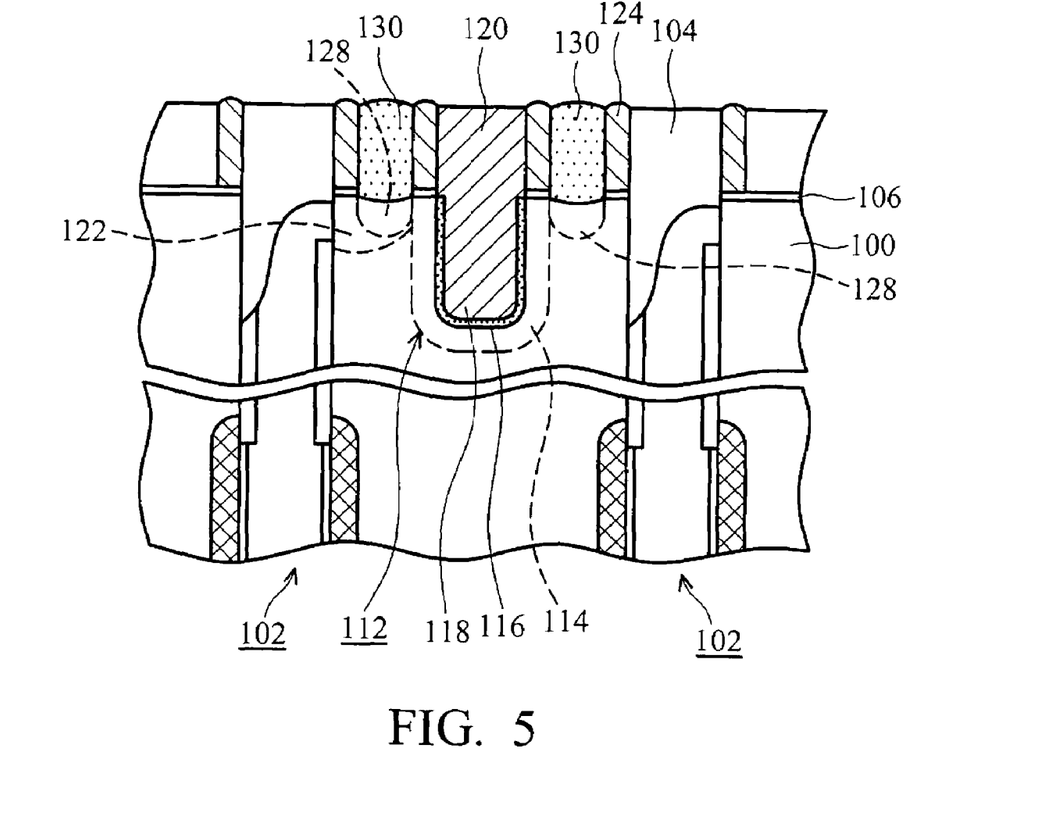
FIG. 5 is cross section view illustrating the method for forming buried portions of an embodiment of the invention.
Figure 6:
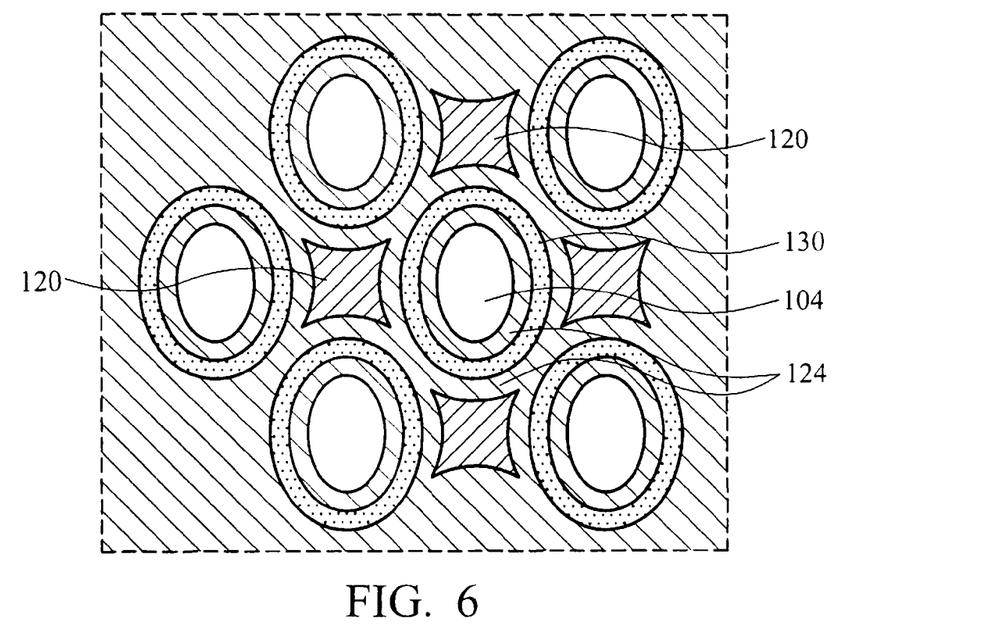
FIG. 6 is a top view illustrating the arrangement of deep trench capacitor devices, recessed gates, spacers, and buried portions of an embodiment of the invention.

Referring to FIG. 5 and FIG. 6, a layer of conductive material, preferably comprising doped poly or metal, is formed over the substrate 100 and filled into the spaces 126 between the spacers 124. The layer of conductive material, the spacers 124, the deep trench capacitor devices 102 and the recessed gates 112 are then planarized to form buried portions 130 in the spaces 126 between the spacers 124. The buried portions 130 surround the upper portions 104 of the deep trench capacitor devices 102, as shown in the FIG. 5 and FIG. 6. The planarizing process, can be accomplished by a chemical mechanical polishing (CMP) process, a blanket etching back process or a recess etching process.

FIG. 6 shows a top view of the patterns of upper portions 104 of deep trench capacitor devices 102, the spacers 124, the buried portions 130, and the protrusions 120 of recessed transistors 112 after planarizing.

Figure 7:
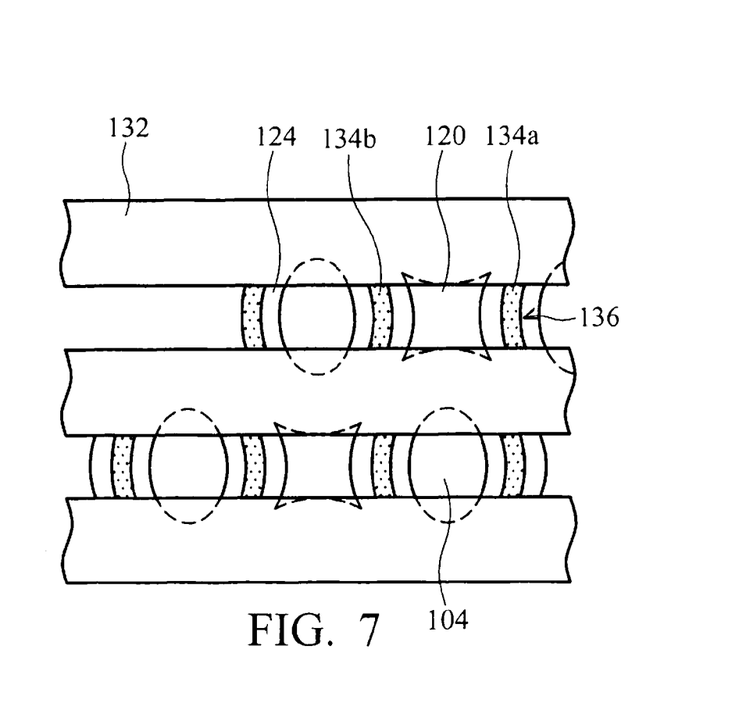
FIG. 7 is a top view illustrating the arrangement of shallow trenches, patterned deep trench capacitor devices, patterned recessed gates, patterned spacers, and patterned buried portions of an embodiment of the invention.

Referring to FIG. 6 and FIG. 7, the spacers 124, the circular implantation region 127, the buried portions 130, the deep trench capacitor devices 102 and the recessed gates 112 are patterned to form parallel shallow trenches 132. The patterning process can be accomplished by a photolithography process and an etching process. The patterning process simultaneously defines active regions 136 and creates isolation regions to isolate the transistors.

Figure 8:
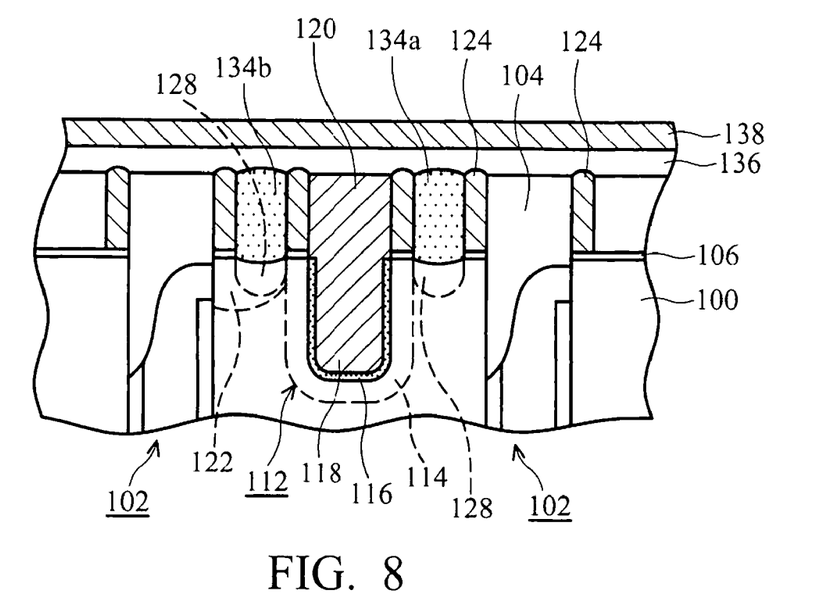
FIG. 8 is cross section view illustrating the method for forming word lines of an embodiment the invention.

Referring to FIG. 7 and FIG. 8, the parallel shallow trenches 132 are adjacent to patterned edges of the deep trench capacitor devices 102 and the recessed gates 112. In other words, the remaining circular implantation region 127, the remaining spacers 124 and the remaining buried portions 130 are separated into several regions at the sides of the deep trench capacitors 102 and the recessed gates 112. Therefore, patterned buried portions 134a and 134b are formed, and the patterned buried portions 134a serve as buried contacts or buried bit line contacts 134a while the patterned buried portions 134b serve as buried capacitors or capacitor buried surface straps 134b. Also, the remaining circular implantation regions 127 serve as source/drain regions 128 on opposite sides of the recessed channel area 114.

A layer of dielectric material is then formed in the shallow trenches. The dielectric material can be oxide deposited by a high density plasma (HDP) process to form shallow trench isolations in the related art. Consequently, the dielectric material is planarized to expose the upper portions 104, the spacers 124, the patterned buried portions 134a and 134b, and the protrusions 120.

Referring to FIG. 8, a layer of conductive material 136 is deposited over the entire substrate 100. The conductive material is preferably selected from a simplified pure metal silicide, for example tungsten silicide (WSi), or metal, for example tungsten (W). Preferably, the thickness of the conductive material layer 136 is about 600 Å to 800 Å. A layer of dielectric material 138 is then deposited over the conductive material 136. The dielectric material 138 is preferably selected from SiN formed by a CVD process. Preferably, the thickness of the dielectric material layer 138 is about 800 Å to 1500 Å. The dielectric material layer 138 will serve as an etching stop layer for a self-aligned upper bit line contact hole formed in following process.

Thus, the invention is advantageous in that a pure metal or pure metal silicide is directly deposited on top of the recess gates 120. No blanket poly layer is needed. In addition, a pure metal or pure metal silicide is used as gate conductor. Overall gate conductor thickness can be reduced, since there is no poly layer. The reduction of gate conductor thickness makes the subsequent bit line contact holes etching process much easier to perform, and also reduces the bit line and word line coupling.

Figure 9:
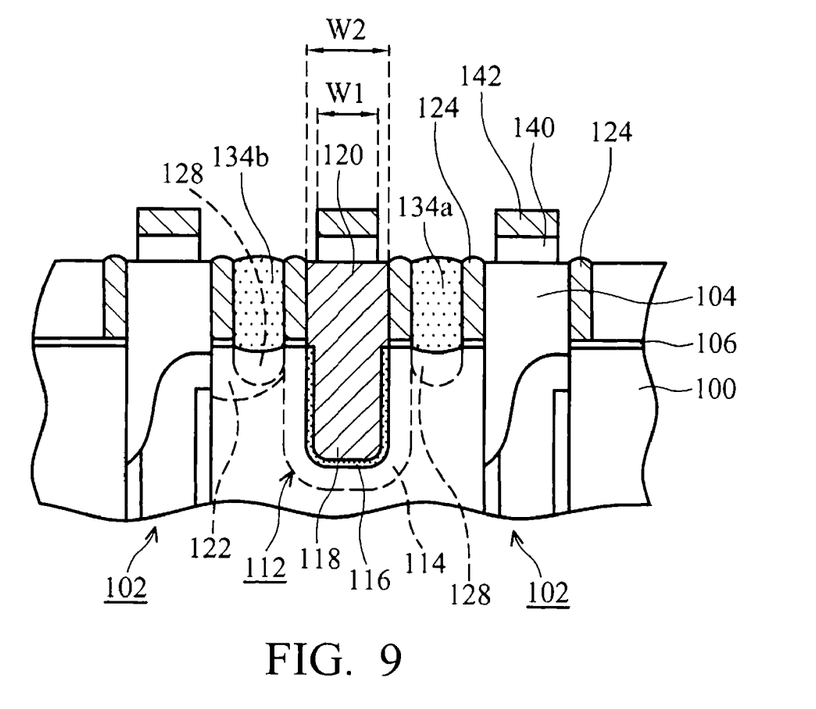
FIG. 9 is cross section illustrating the method for forming word lines of an embodiment of the invention.

Referring to FIG. 9, the dielectric material layer 138 and the conductive material layer 136 are patterned by a photolithography process and an etching process to form word lines 140 and gate cap dielectrics 142. The word lines 140 are formed lying across some of the deep trench capacitor devices 102 and/or lying across some of the recessed gates 112.

At least one of the word lines comprises portions overlapping the recessed gates 120. The at least one of the overlapped portions has a narrower width W1 than the width W2 of the recessed gates 120.

In some embodiments of the invention, the word lines are disposed in parallel. The width of the word lines is narrower than that of the recessed gates 112.

Figure 12:
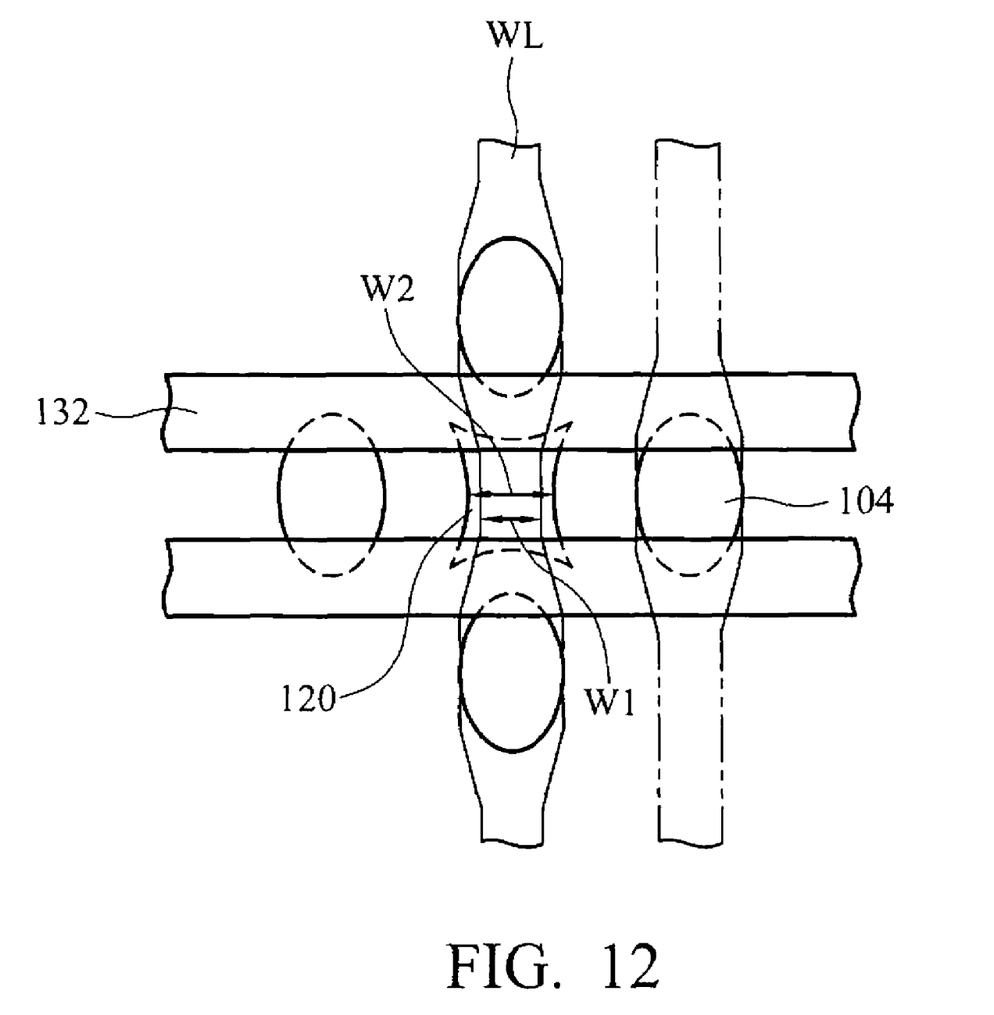
FIG. 12 is a top view illustrating the arrangement of shallow trenches, patterned deep trench capacitor devices, patterned recessed gates, and word lines of an embodiment of the invention.

Referring to FIG. 12, in some embodiments of the invention, at least one of the word lines has several portions with different widths. At least one of the portions overlapping a recessed gate 112. And the overlapped portion has a narrower width W1 than the width W2 of the recessed gate 112.

Figure 10:
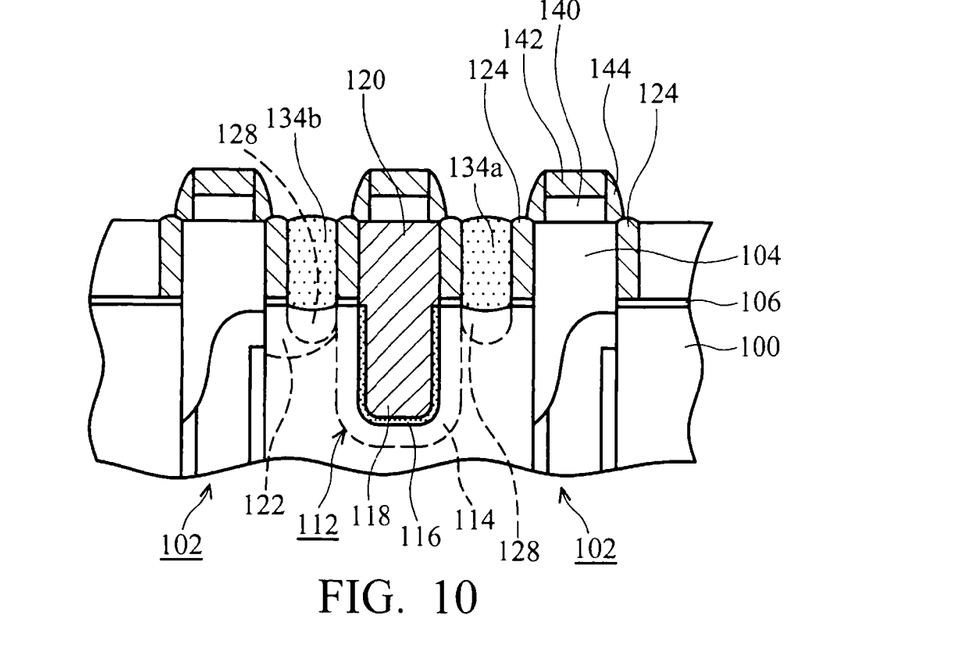
FIG. 10 is cross section view illustrating the method for forming word lines of an embodiment of the invention.

Referring to FIG. 10, second spacers 144 are formed on the side walls of word lines 140 and gate cap dielectrics 142, preferably nitride, can be formed using a CVD process and an RIE etch back process. Preferably, the thickness of the nitride spacers 144 is 300 Å to 3000 Å.

Figure 11:
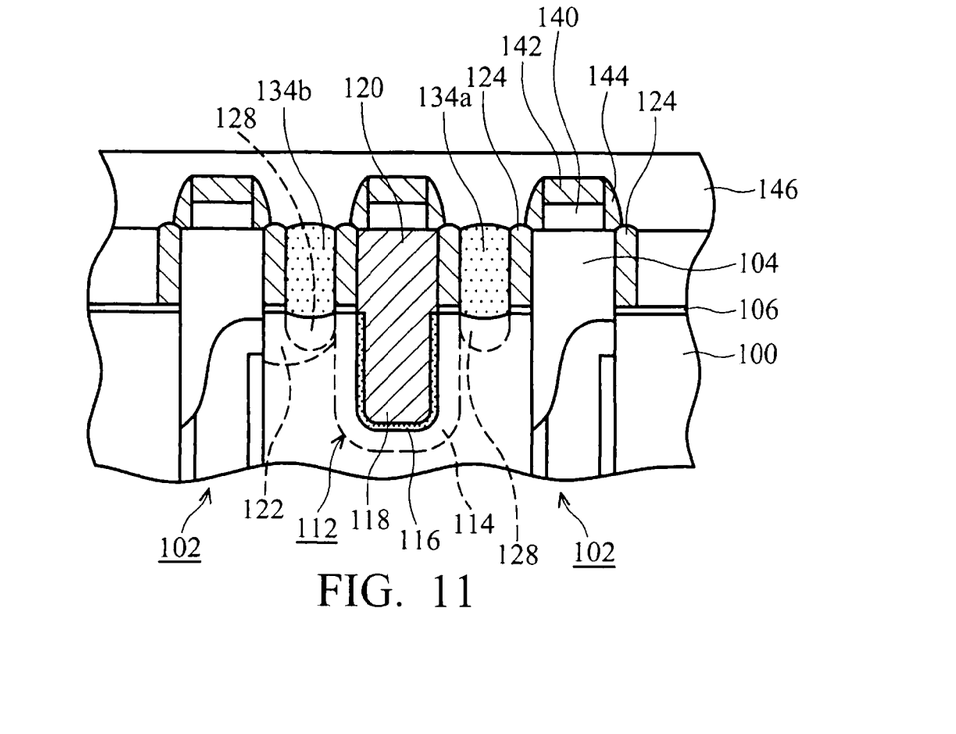
FIG. 11 is cross section view illustrating the method for forming bit line contacts of an embodiment of the invention.
Figure 20:
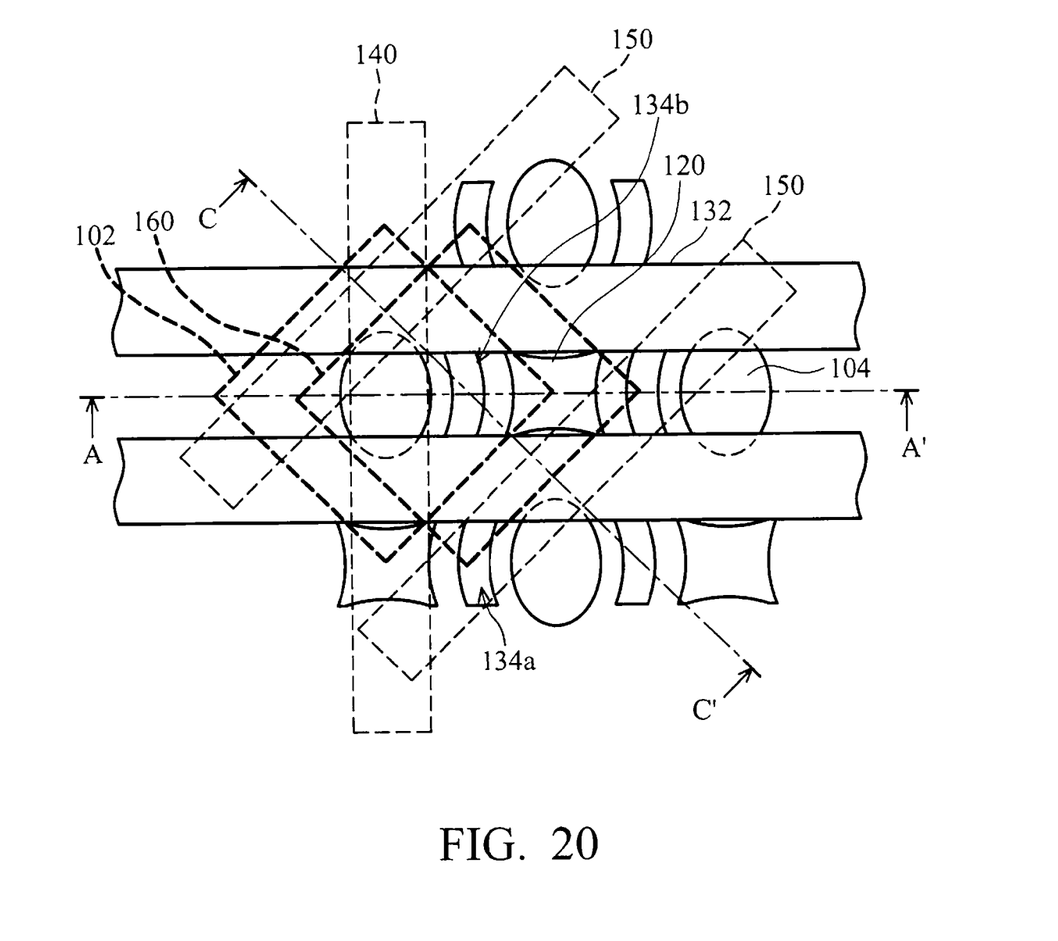
FIG. 20 is a top view illustrating the arrangement of shallow trenches, patterned deep trench capacitor devices, patterned recessed gates, word lines, bit lines, and stack capacitors of an embodiment of the invention.

Referring to FIG. 11, the cross-section along line A-A' of FIG. 20, a second layer of dielectric material 146 is formed over the substrate. The second layer of dielectric material comprises BPSG deposited and reflowed following conventional processes.

Figure 13:
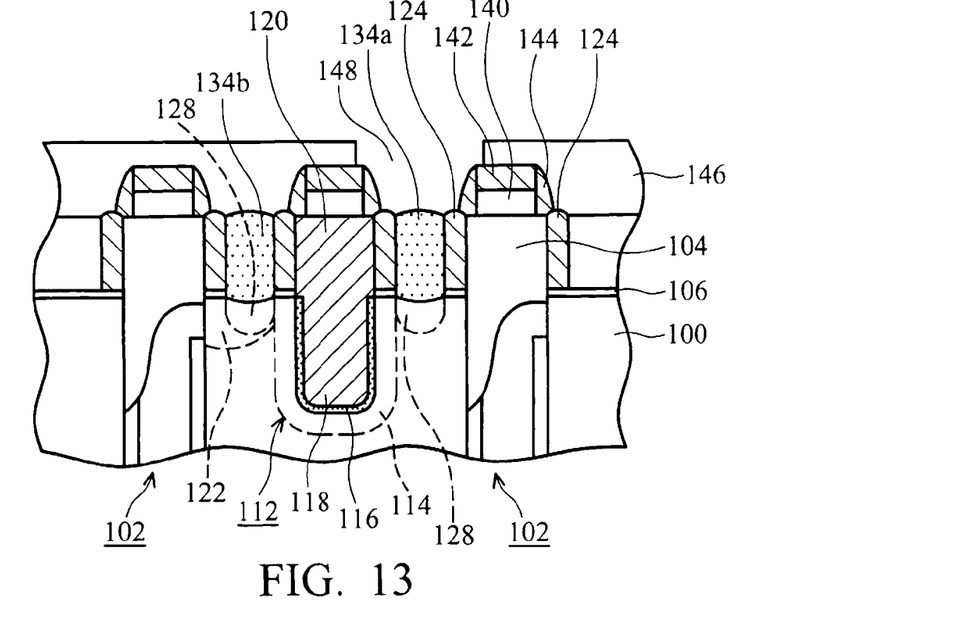
FIG. 13 is cross section view illustrating the method for forming bit line contacts of an embodiment of the invention.

Referring to FIG. 13, the second layer of dielectric material 146 is patterned by a photolithography process and an etching process to form bit line contact holes 148 on the buried bit line contacts 134a, exposing the buried bit line contacts 134a.

Figure 14:
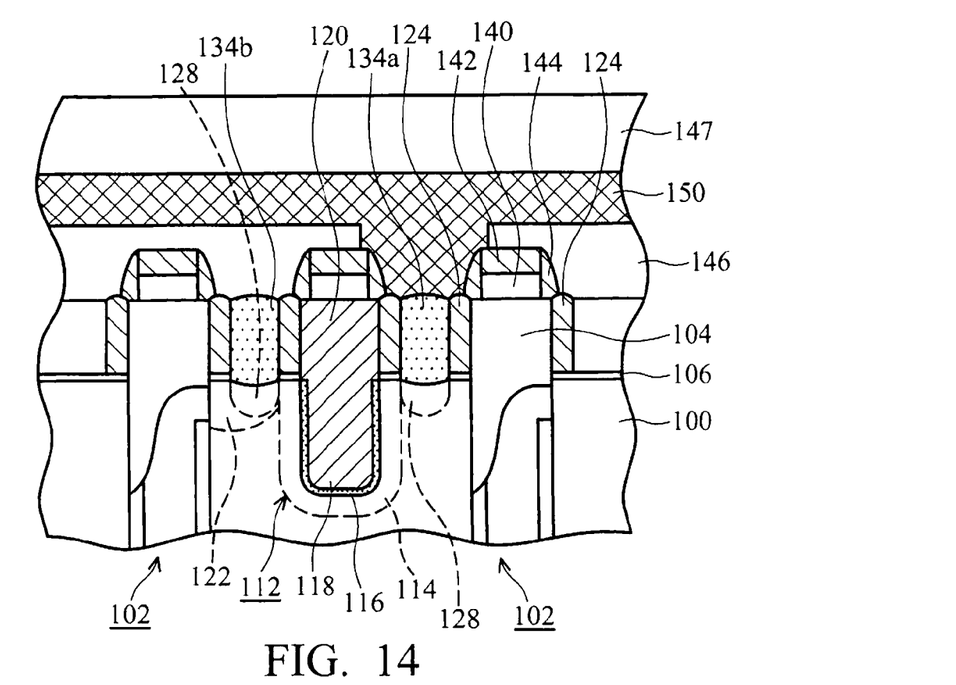
FIG. 14 is cross section view along line A-A' of FIG. 20 illustrating the method for forming bit line contacts of an embodiment of the invention.

Referring to FIG. 14, the cross-section along line A-A' of FIG. 20, a second layer of conductive material is formed on the second layer of dielectric material 146 and fills the bit line contact holes 148 to form upper bit line contacts. Consequently, referring to FIG. 20, the layer of metal material is patterned to form bit lines 150 without crossing the capacitor buried surface straps 134b to connect with the upper bit line contacts. Thereafter, forming a third layer of dielectric material 147 on the bit lines 150. In some embodiments, the bit lines are formed diagonally with an angle to the word lines. Preferably, the bit lines are formed diagonally at a 45 degrees angle to the word lines 140, as marked by the dashed line.

Alternatively (not show), bit lines and the upper bit line contacts can be optically patterned by a conventional dual damascene process. The upper bit line contact holes 148 are formed by a selective self-aligned RIE to expose the buried bit line contacts 134a and bit line trenches are formed by simple BPSG etch through. Metal liners (CVD or PVD Ti/TiN) and CVD tungsten (W) bit lines are then deposited and subjected to CMP to form dual damascene upper bit line contacts and bit lines without crossing the capacitor buried surface straps 134b. In some embodiments, the bit lines are formed diagonally at a predetermined degree, preferably 45 degrees, to the word lines.

Figure 15:
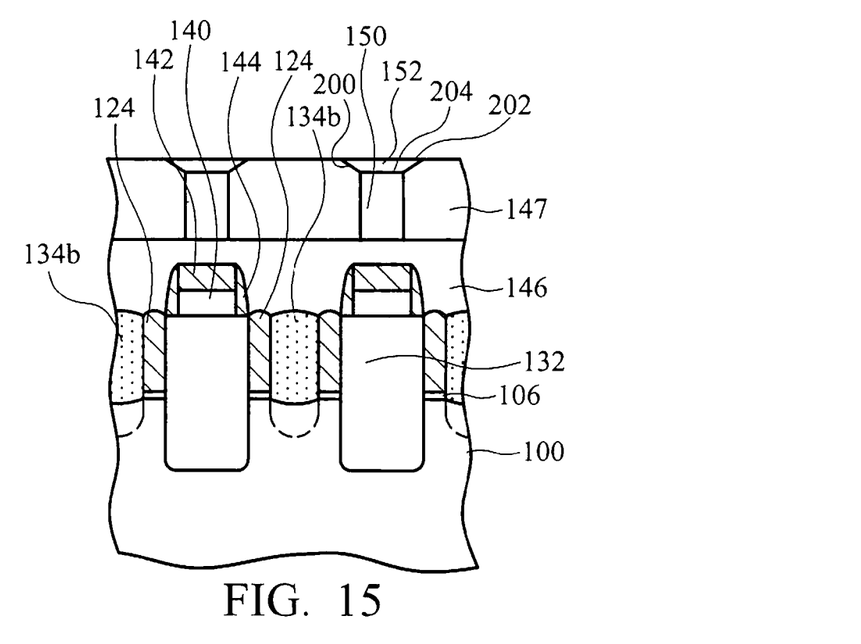
FIG. 15 is cross section view along line C-C' of FIG. 20 illustrating the method for forming an etch stop layer on the surface of bit line of an embodiment of the invention.

Referring to FIG. 15, the cross-section along line C-C' of FIG. 20, the third layer of dielectric material 147 are patterned to form tapered openings 200 within the third layer of dielectric material 147 to expose the bit lines 150. Upper edges 202 of the tapered openings 200 are wider than lower edges 204 thereof. The tapered openings 200 are filled with dielectric material, preferably selected from SiN formed by a CVD process, and subsequently followed by executing chemical mechanical polishing to form an etch stop layer 152 on the bit lines.

Figure 16:
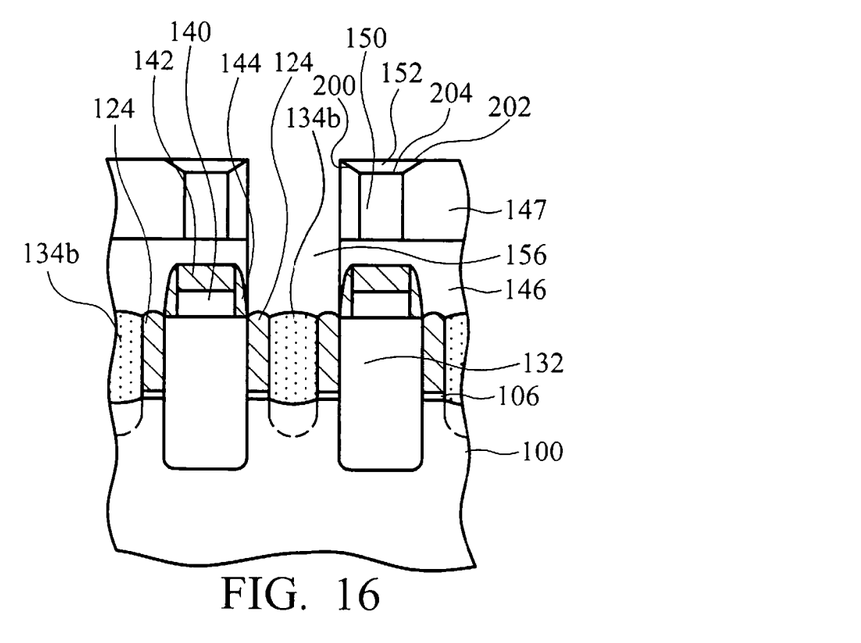
FIG. 16 is cross section view along line C-C' of FIG. 20 illustrating the method for forming a stack capacitor of an embodiment of the invention.

Referring to FIG. 16, a fourth layer of dielectric material 154 is formed over the substrate. The fourth layer of dielectric material 154 comprises BPSG deposited and is reflowed following conventional processes, and patterned by a photolithography process and an etching process to form second holes 156 passing through the second layer of dielectric material 146, third layer of dielectric material 147 and fourth layer of dielectric material 154 to and exposing the capacitor buried surface straps 134b, wherein the second holes 156 are preferably adjacent to upper edges of the etch stop layer 152.

Figure 17:
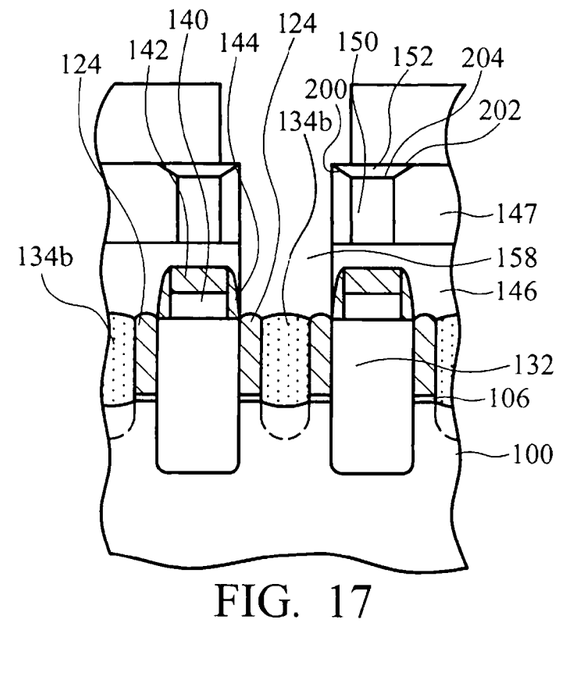
FIG. 17 is cross section view along line C-C' of FIG. 20 illustrating the method for forming a stack capacitor of an embodiment of the invention.

Referring to FIG. 17, stack capacitors plug holes 158 with widths larger than the second holes 156 are formed. In addition, the stack capacitors plug holes 158 passing through the fourth layer of dielectric material 154 to top surface of the etch stop layer 152 are communicated with the second holes 156.

Figure 18:
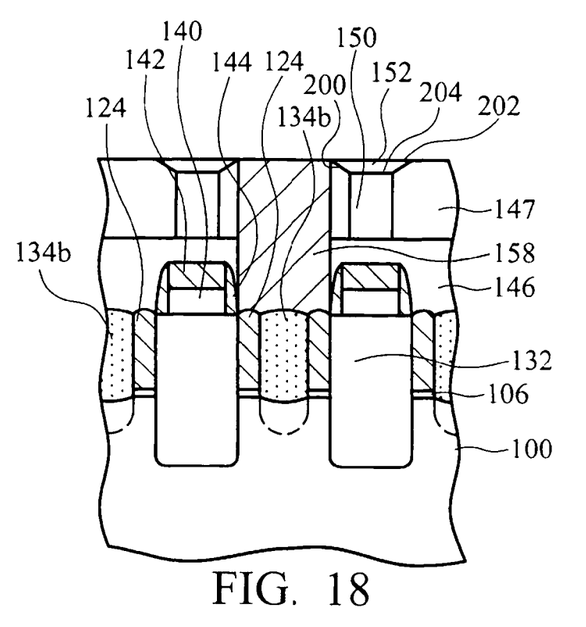
FIG. 18 is cross section view along line C-C' of FIG. 20 illustrating the method for forming a stack capacitor of an embodiment of the invention.
Figure 19:
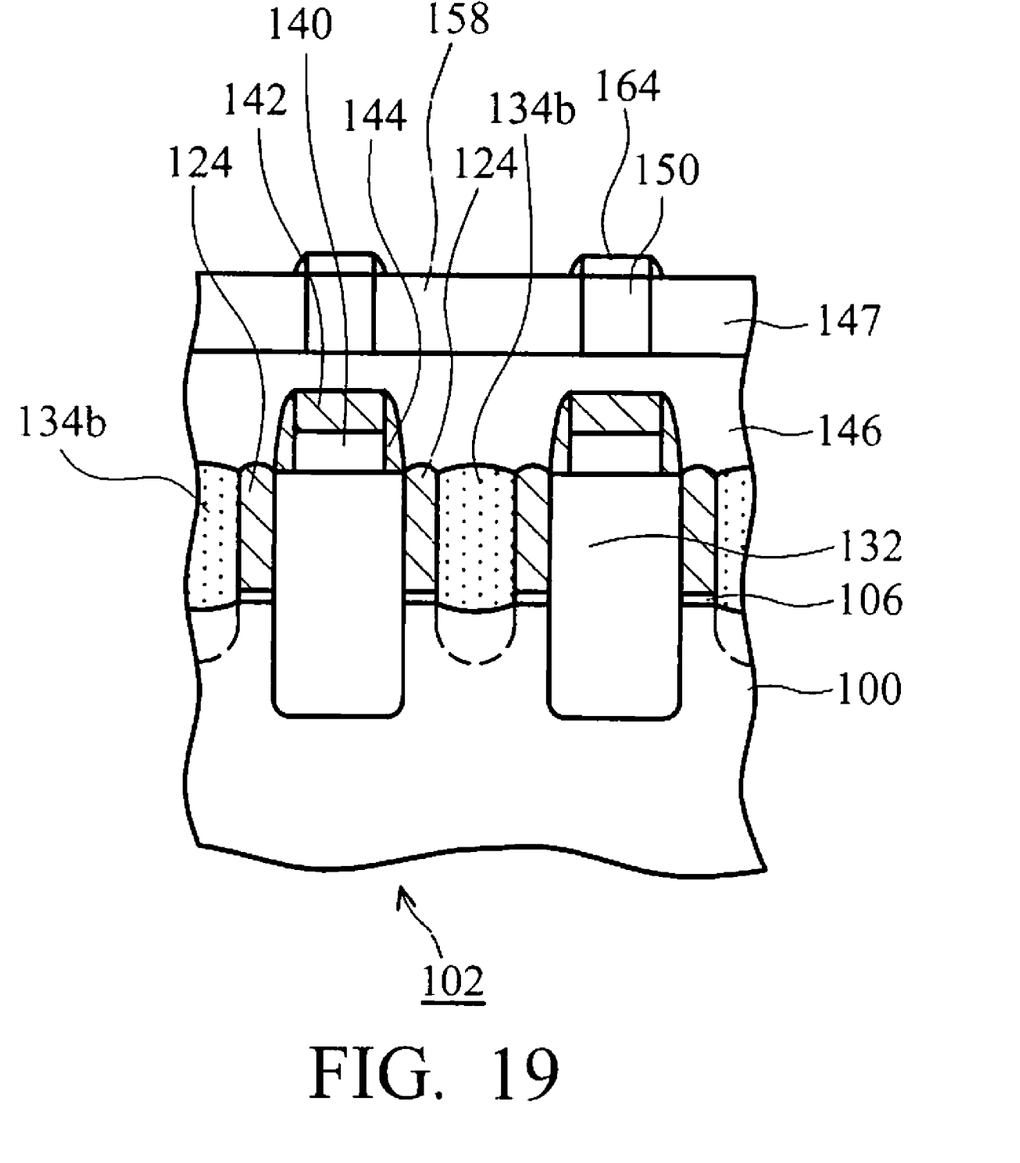
FIG. 19 is cross section view along line C-C' of FIG. 20 illustrating the method for forming an etch stop layer on the surface of bit line of an embodiment of the invention.

Referring to FIG. 18, the cross-section along line C-C' of FIG. 20, a third layer of conductive material is formed on the fourth layer of dielectric material 154 and fills the stack capacitors plug holes 158 to form the stack capacitor plugs 160 to connect with the capacitor buried surface straps 134b. Consequently, referring to FIG. 20, the stack capacitor plugs 160 without intercrossing with the bit lines 150 connect to stacked capacitors (not shown) formed by a conventional technology.

Alternatively, referring to FIG. 10, a third layer of dielectric material 147, preferably selected from SiN, formed by CVD process is formed over the substrate. The lithography and etching process are subsequently executed to form a cap layer 164 on a top surface of the bit lines 150. Spacer layers are formed on sidewalls of the cap layer 164.

Figure 21:
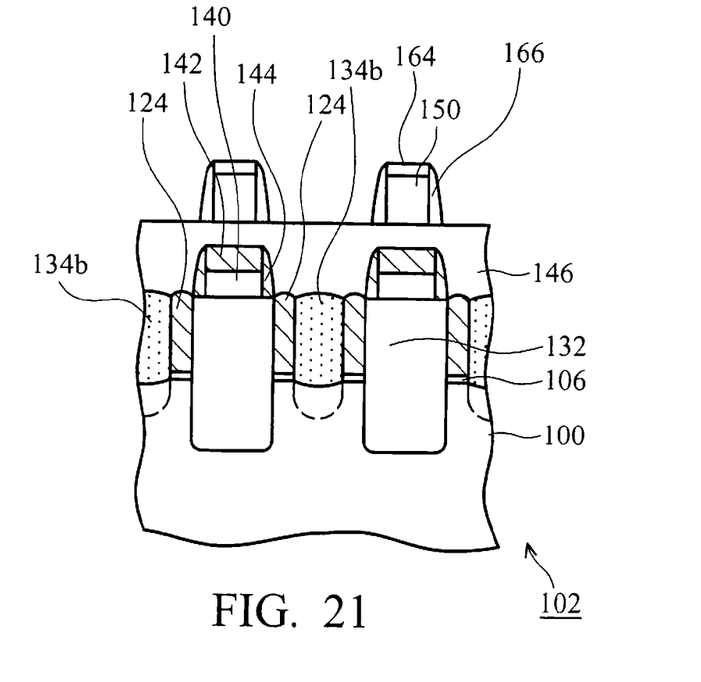
FIG. 21 is cross section view along line C-C' of FIG. 20 illustrating the method for forming an etch stop layer on the surface of bit line of an embodiment of the invention.

Referring to FIG. 21, the spacer layers are etched to form spacers 166 on sidewalls of the cap layers 164 and the bit lines 150. In the preferred embodiment of the invention, the etching step is anisotropic etching, which can use $CHF_3$, a combination of $CF_4$ and O2, or a combination of $C_2F_6$ as the main etchant, and can also be further enhanced with plasma when the spacer layer are silicon nitride. When the spacer layers are silicon oxide, the anisotropic etching can use $CHF_3$, a combination of $CF_4$ and $O_2$, a combination of $CF_4$, or $C_2F_6$ or $C_3F_8$ as the main etchant, and can also be further enhanced with plasma.

Figure 22:
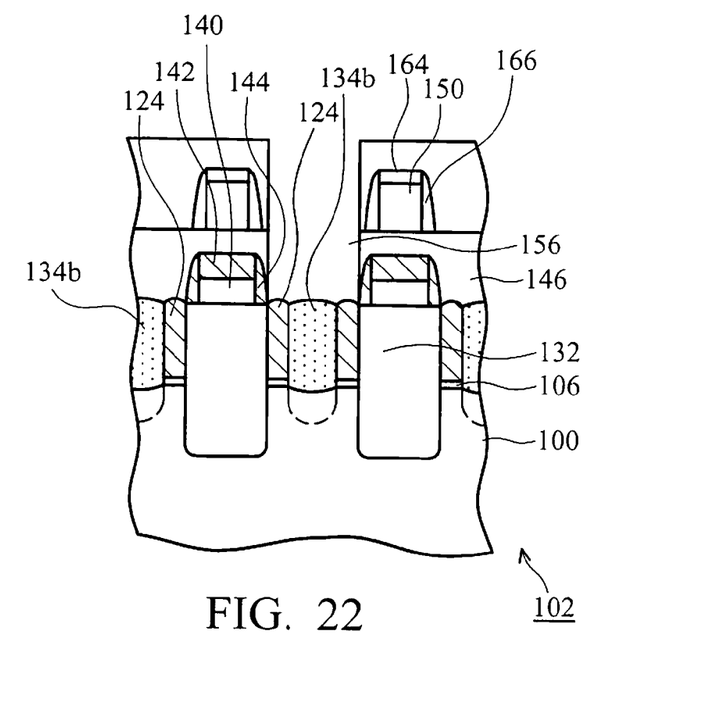
FIG. 22 is cross section view along line C-C' of FIG. 20 illustrating the method for forming a stack capacitor of an embodiment of the invention.
Figure 23:
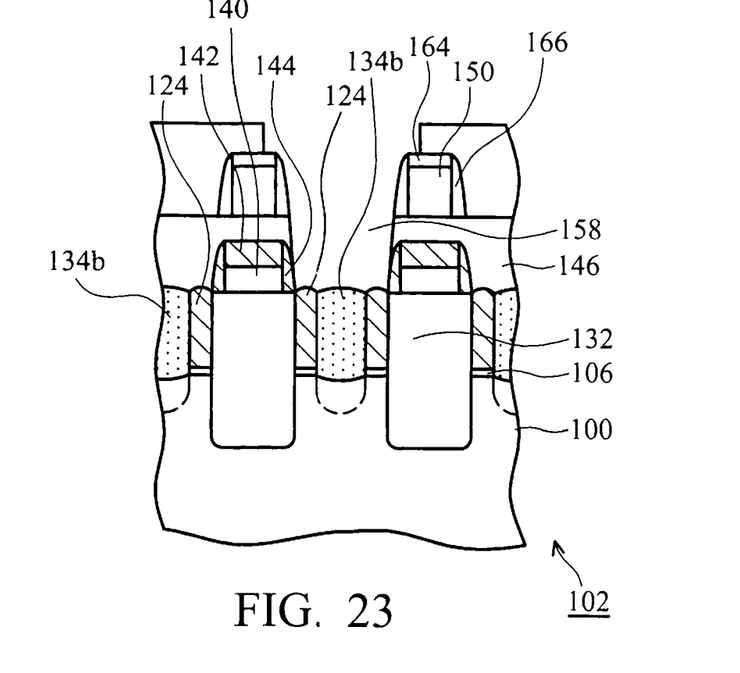
FIG. 23 is cross section view along line C-C' of FIG. 20 illustrating the method for forming a stack capacitor of an embodiment of the invention.

Referring to FIG. 22, the fourth layer of dielectric material 154 is patterned by a photolithography process and an etching process to form second holes 156 passing through the second layer of dielectric material 146 and fourth layer of dielectric material 154 to and exposing the capacitor buried surface straps 134b wherein the second holes 156 are preferably adjacent to the third spacers 166. Then, referring to FIG. 23, the fourth layer of dielectric material 154 are etched to form a self-aligned stack capacitors plug holes 158 between the second spacers 144 and the third spacers 166. Stack capacitors plug holes 158 with widths larger than the second holes 156 are subsequently formed. In addition, the stack capacitors plug holes 158 passing through the fourth layer of dielectric material 154 to the cap layer 164 on a top surface of the bit lines 150 are communicated with the second holes 156.

Figure 24:
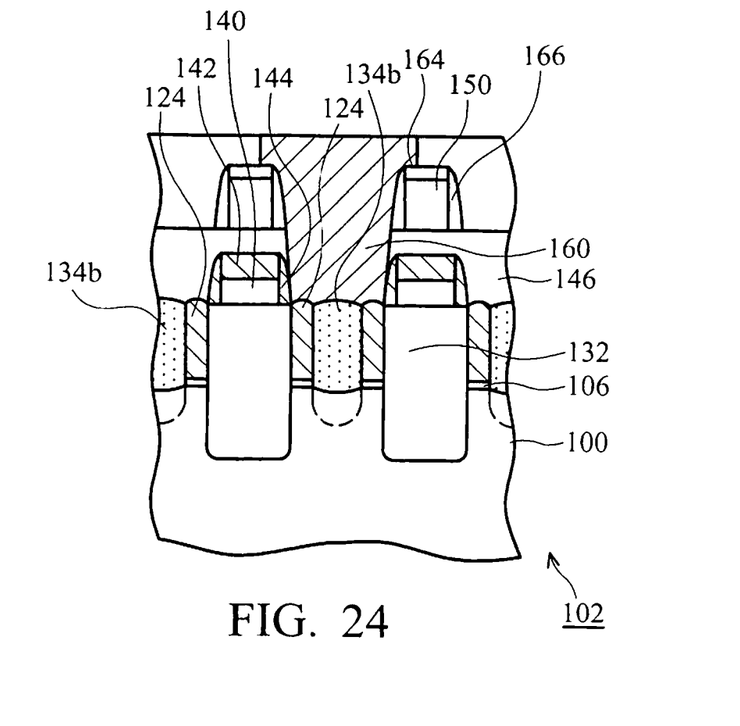
FIG. 24 is cross section view along line C-C' of FIG. 20 illustrating the method for forming a stack capacitor of an embodiment of the invention.

Referring to FIG. 24, the cross-section along line C-C' of FIG. 20, a third layer of conductive material is formed on the fourth layer of dielectric material 154 and fills the stack capacitors plug holes 158 to form the stack capacitor plugs 160 to connect with the capacitor buried surface straps 134b. Consequently, referring to FIG. 20, stack capacitor plugs 160 without intercrossing with the bit lines 150 connect to stacked capacitors (not shown) formed by a conventional technology.

Referring to FIG. 14, FIG. 18, FIG. 20, and FIG. 24, the invention further discloses a semiconductor device, which comprises a substrate with recessed gates 118 and deep trench capacitor devices 102 therein, wherein protrusions 120 of the recessed gates 118 and upper portions 104 of the deep trench capacitor devices 102 are above the substrate. Spacers 124 are formed on sidewalls of the upper portions 104 and the protrusions 120, and buried portions of conductive material exist in spaces between the spacers 124, wherein the buried portions comprise buried bit line contacts 134a and capacitor buried surface straps 134b. Word lines 140 are formed across the recessed gates 118. Upper bit line contacts 148 are formed on the buried bit line contacts 134a connecting with the buried bit line contacts 134a and bit lines 150 formed thereon. And the stack capacitor plugs 160 connect with the capacitor buried surface straps 134b and the stacked capacitors (not shown).

When compared with the related art, the stack capacitor gains more capacity so as to gain improvement on device performance due to the diagonally disposed bit lines and the stack capacitor, thus, the capacitance of the RAM is provided. Moreover, the word lines occupy a smaller space. The word line structures save space for bit line contacts and enlarge the window for forming upper bit line contacts. Another advantage of the word line structures is that they improve word line RC delay and also reduce the bit line and word line coupling.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate with recessed gates and deep trench capacitor devices therein, wherein protrusions of the recessed gates and upper portions of the deep trench capacitor devices are above the substrate;
   spacers on sidewalls of the upper portions and the protrusions;
   buried portions of conductive material in spaces between the spacers, wherein the buried portions comprises buried bit line contacts and capacitor buried surface straps;
   word lines across the recessed gates;
   upper bit line contacts on the buried bit line contacts;
   bit lines connecting to the upper bit line contacts, wherein the capacitor buried surface straps are not covered by the bit lines; and
   stack capacitors with plugs connecting to the capacitor buried surface straps.

2. The semiconductor device of claim 1, wherein at least one of the word lines comprises portions overlapping the recessed gates, at least one of the overlapped portions having a narrower width than at least one of the recessed gates.

3. The semiconductor device of claim 1, wherein the bit lines are disposed diagonally at an angle to the word lines.

4. The semiconductor device of claim 1, wherein the bit lines are diagonal to the word lines by 45 degrees.

5. The semiconductor device as claimed in claim 1, further comprising bit lines with a cap layer thereon.

6. The semiconductor device as claimed in claim 5 wherein upper edges of the cap layer are wider than lower edges thereof.

7. The semiconductor device as claimed in claim 5, further comprising bit line spacers on sidewalls of the bit lines and the cap layer.

8. The semiconductor device as claimed in claim 1, wherein the spaces further surround the upper portions of the deep trench capacitor devices.

* * * * *